United States Patent [19]

Nakano

[11] Patent Number: 4,728,753
[45] Date of Patent: Mar. 1, 1988

[54] AFFIXATION DEVICE FOR ELECTRONIC DISPLAY

[75] Inventor: Yoshihito Nakano, Yokohama, Japan

[73] Assignee: Kitagawa Industries Co., Ltd., Nagoya, Japan

[21] Appl. No.: 836,152

[22] Filed: Mar. 4, 1986

[30] Foreign Application Priority Data

Apr. 8, 1985 [JP] Japan .............. 60-51984[U]

[51] Int. Cl.⁴ .................... H05K 7/12; H05K 1/18
[52] U.S. Cl. ................ 174/138 G; 248/500; 361/403
[58] Field of Search ............ 174/138 G; 361/400, 361/403, 417, 418, 419; 339/17 CF; 248/221.3, 221.4, 500

[56] References Cited

U.S. PATENT DOCUMENTS

| | | |
|---|---|---|
| 4,030,000 | 6/1977 | Stewart et al. .............. 361/400 |
| 4,417,095 | 11/1983 | Beun .............. 361/403 X |
| 4,618,915 | 10/1986 | Bury .............. 174/138 G X |
| 4,619,431 | 10/1986 | Matsui et al. .............. 248/500 |

FOREIGN PATENT DOCUMENTS

2135454 1/1973 Fed. Rep. of Germany ... 174/138 G
2718442 11/1978 Fed. Rep. of Germany ...... 361/400

Primary Examiner—Laramie E. Askin
Attorney, Agent, or Firm—Oblon, Fisher, Spivak, McClelland & Maier

[57] ABSTRACT

An affixation device for an electronic display which comprises a flat platelike rest (1a, 1b, 1c) on which a platelike electronic display (2a, 2b, 2c) is set, support members (43a, 44a, 43b, 44b, 43c, 44c) which hold the flat platelike rest (1a, 1b, 1c) on a wiring board (37a, 37c), and a terminal holding member (7a, 7b, 7c) with a plurality of insertion grooves formed at the edge portion (3Ba, 3Bb, 3Bc) of the platelike rest (1a, 1b, 1c) to hold terminals (50a, 50b, 50c) of the electronic display.

7 Claims, 22 Drawing Figures

AFFIXATION DEVICE FOR ELECTRONIC DISPLAY

BACKGROUND OF THE INVENTION

1. Field of the Invention

The present invention relates to a device for affixing an electronic display, particularly to a device for affixing an electronic display with high stability and accuracy to a wiring board by a simple attaching operation.

2. Prior art

Conventionally, an electronic display such as a liquid-crystal or fluorescent display tube for digitally or graphically showing a volume of sound, frequency, revolution speed, time, measurement result or the like is attached to a home electric appliance such as a television set, radio, video tape recorder, microwave oven, stereo, or a measuring instrument. The electronic display is normally mounted in association with an opening of the casing of the appliance or the like so that indications can be seen from outside the appliance. To increase the quantity of information to be shown on the electronic display, the number of signal lines must be increased. An electronic display is sometimes equipped with several tens of terminals. In order to facilitate wiring to the terminals, they are often attached directly to a wiring board having a printed circuit by soldering or the like. To affix such an electronic display, a two-side sticking tape or adhesive agent is stuck to the wiring board, a buffer made of chloroprene sponge or the like is stuck to the tape or adhesive agent, another two-side sticking tape or adhesive agent is stuck to the buffer, the back of the electronic display is stuck to the latter two-side sticking tape or adhesive tape, and the terminals of the electronic display are inserted into the insertion holes of the wiring board so that the electronic display is supported. However, such problems as those mentioned next occur. Firstly, it is not easy to attach the electronic display. When the display is stuck instead of being attached by an affixation device, it is troublesome to apply an adhesive agent or remove covering paper from a two-side sticking tape. Especially when the adhesive agent is used, it is time-consuming to dry the agent. For these reasons, automation is difficult and a number of manufacturing processes are required, thereby hindering productivity. Secondly, it is difficult to position the electronic display. This matters particularly in the case when there is a certain distance between the wiring board and an external casing and the electronic display is set spaced from the wiring board. In this case, as the attached position of the display is forcibly corrected in order to make the display coincide with a display opening frame after the sticking of the display, some of the terminals of the display are apt to be distorted, thereby decreasing reliability. Thirdly, the packaging density on the wiring board is decreased. When the electronic display is directly mounted on the wiring board, a space, which would not be required if the display were attached to a casing, must be provided on the wiring board, thereby lowering the packaging density of other electronic displays on the wiring board. When the electronic display is attached to the casing, a process of connecting the terminals of the display to a circuit on the wiring board is needed, and it is inconvenient to remove the electronic display for maintenance work or the like.

SUMMARY OF THE INVENTION

The object of the present invention is to provide an affixation device for an electronic display by which an electronic display can be easily attached to a wiring board in such a manner that exact positioning is enabled and the packaging density of the electronic display on the wiring board is increased, and accurate assembling is ensured even though the assembling process is automated.

The present invention has a construction for solving the abovementioned problems. The construction is such that the electronic display affixation device, in which the electronic display is put on a flat platelike rest and supported on the wiring board by support members, includes a terminal holding member with a plurality of insertion grooves to hold terminals of the electronic display at the edge portion of the platelike rest.

The platelike rest has a form corresponding to that of the electronic display, and it is affixed at a predetermined height from the wiring board by the support members such as snaps which have engaging projections, e.g., the tip of which is shaped like an arrowhead. Furthermore, the platelike rest is equipped with holding members at the pair of opposed edges of the rest to hold the electronic display. Another pair of opposed edges are equipped with positioning members at the place to which the edges of the electronic display are directly connected.

The terminal holding member has a plurality of grooves so as to hold and protect the terminal of the electronic display when the electronic display is mounted on the platelike rest. For example, it is helpful to guide the terminal to the accurate position on the wiring board.

All the members and elements described above may be made from various kinds of plastics such as a condensation polymer of polyamide type and a condensation polymer of polyester type. These members and elements may be either separately manufactured and then combined together, or integrally formed to reduce the number of manufacturing processes.

The purpose of the electronic display affixation device provided with the abovementioned construction according to the present invention is to support the platelike rest on the wiring board with the support members and affix the electronic display on the platelike rest. At the edge of the platelike rest of the affixation device, the terminal insertion grooves are formed so as to protect terminals and guide them to the correct holes of the wiring board. Moreover, the insertion grooves are formed to be narrower as approaching to the wiring board, and to be wider as approaching to the inlet portion. As a result, the insertion of the terminals of the electronic display can be easily done. In case that the electronic display is to be mounted on the affixation device which is affixed on the wiring board, the terminals can be easily inserted into the grooves and guided to the holes of the wiring board.

DETAILED DESCRIPTION OF THE PREFERRED EMBODIMENTS

The embodiments of the present invention are hereinafter described in detail referring to the drawings.

FIGS. 1 through 10 illustrate the first embodiment of the present invention.

In the abovementioned figures, numeral 1a denotes a platelike rest having a planar surface on which the electronic display is placed, and which is formed on the upper surface of the affixation device made of synthetic resin. At one edge 3Aa of the platelike rest 1a in its transverse direction, the projections 6Aa and 6Ba are formed to be adjacent to the edge 5a of the electronic display 2a in its transverse direction. In addition, at another edge 3Ba, the terminal holding members 7a are formed so as to guide a number of terminals extending from the electronic display 2a to the grooves. The grooves of the terminal holding member 7a are formed to be narrower as approaching to the wiring board side 7ab and to be wider in the opposite side 7aa.

At one side in the longitudinal direction, the protective board for a projection 8a is formed to protect the glass-made projection which is obturated when the gas is charged into the tube of the electronic display. At both ends of the affixing device, holding members 11a and 12a are furnished. The holding members are formed as arrowhead-shaped check elements and prevent the disengagement of the electronic display 2a from the platelike rest 1a. Moreover, the holding members 11a and 12a are helpful to easily set the electronic display on the platelike rest 1a by simply pushing the body of the display. The small pieces 25a and 26a are leaf springs which provide a certain stress with the bottom of the electronic display 2a to tightly connect the electronic display and the rest when the electronic display is affixed by the holding members 11a and 12a.

Figure 1:
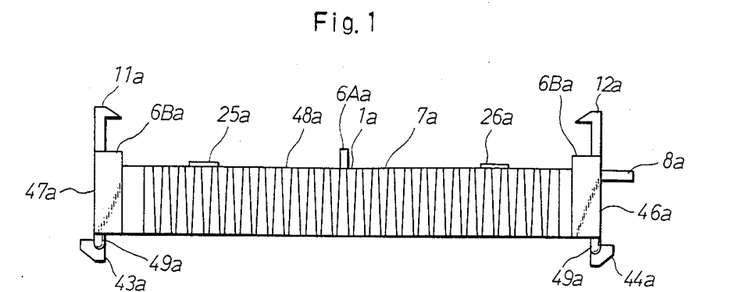
FIG. 1 is a front view of the affixation device of a first embodiment.
Figure 2:
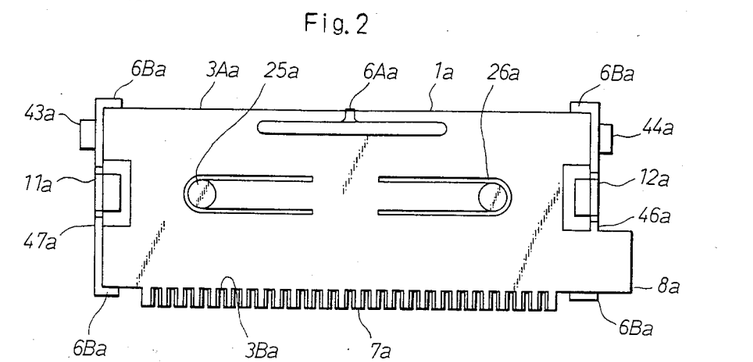
FIG. 2 is a plan view of the affixation device of the first embodiment.
Figure 3:
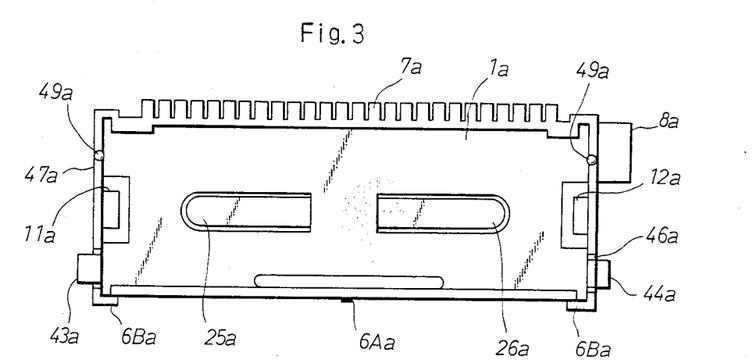
FIG. 3 is a bottom view of the affixation device of the first embodiment.
Figure 4:
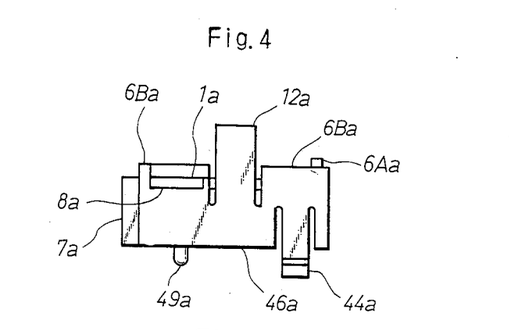
FIG. 4 is a right-hand side view of the affixation device of the first embodiment.
Figure 5:
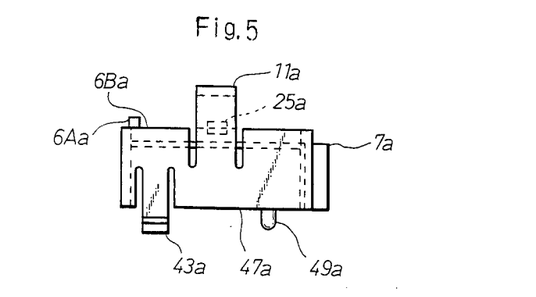
FIG. 5 is a left-hand side view of the affixation device of the first embodiment.
Figure 6:
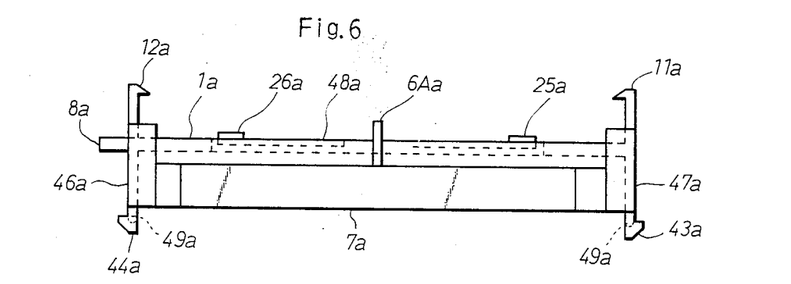
FIG. 6 is a back view of the affixation device of the first embodiment.
Figure 7:
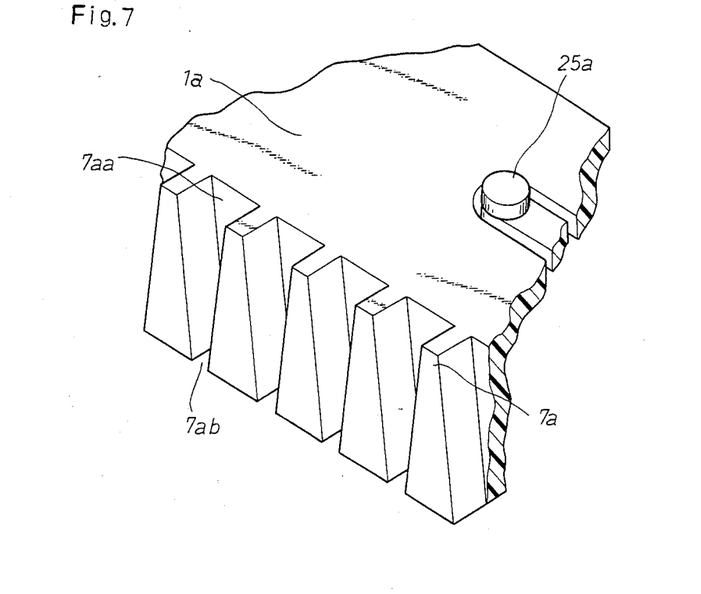
FIG. 7 is a partially enlarged view of the terminal holding member of the first embodiment.
Figure 8:
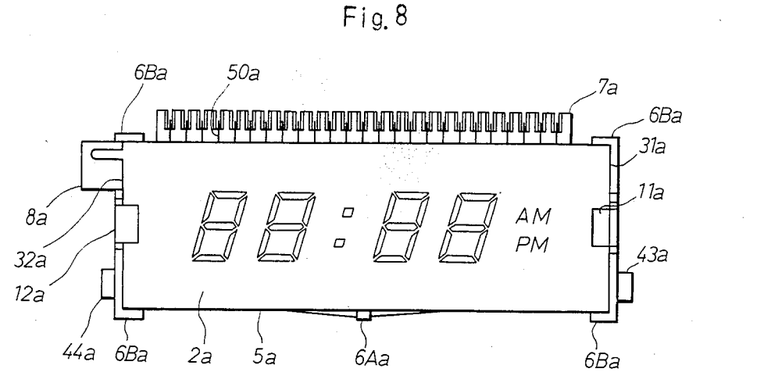
FIGS. 8 and 9 are views showing an electronic display affixed by the affixation device.
Figure 9:
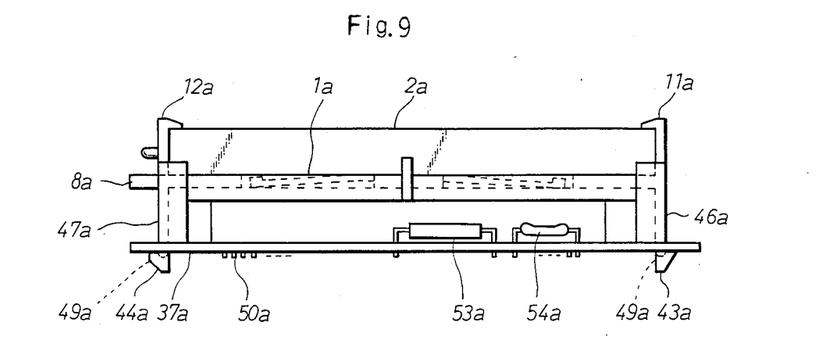

As mentioned above, the body of the electronic display 2a is firmly affixed at both ends 31a and 32a in the longitudinal direction on the platelike rest 1a by the holding members 11a and 12a. Therefore, the terminals of the display 2a are not stressed themselves when the display is affixed. FIGS. 8 and 9 show the condition when the electronic display is affixed on the platelike rest. The support member for stably attaching the wiring board to the chassis of an electric appliance is provided on the back side of the rest 1a. The terminal holding member 7a, which has a certain height for keeping a desired vertical distance between the wiring board 37a and the platelike rest 1a, is integrally formed as the support member at the edge portion in the transverse direction on the back side of the rest 1a. Snaps 43a and 44a as a support member, support legs 46a and 47a, and projections 49a as positioning members are provided at both ends of the back of the platelike rest 1a in such a manner that the snaps, the support legs and the projections are integrated with the platelike rest 1a. By inserting the snaps 43a and 44a, and the support legs 46a and 47a, and the projections 49a into the attaching holes previously provided in the wiring board, the platelike rest 1a can be affixed to the right position on the wiring board 37a. The snaps 43a and 44a are furnished with check elements whose tips are shaped like arrowheads, to surely affix the body of the affixation device. Each projection 49a is shaped like a cylinder having a function to prevent the device from dislocating from the predetermined position.

In accordance with the abovementioned construction, when the affixation device is mounted on the wiring board 37a and then the electronic display 2a is set on the affixation device, the setting of the display 2a to the affixation device and the wiring board can be easily done by fitting the position of the display to that of the affixation device on the basis of the upper edge 48a of the affixation device, and then simply pushing the display. In this case, the terminals 50a of the display 2a are inserted into the terminal holding member 7a with ease even though the arrangement of the terminals lacks uniformity, since the upper portion 7aa of the groove of the holding member 7a is wide. As the groove width at the position 7ab where the holding member 7a is in contact with the wiring board 37a is narrow, the terminals 50a can be easily inserted into the insertion holes of the wiring board 37a.

In case that the affixation device furnished with the electronic display 2a is mounted on the wiring board 37a, the insertion of the terminals 50a can be easily done, since the terminals have been aligned by means of the holding member 7a.

Figure 10:
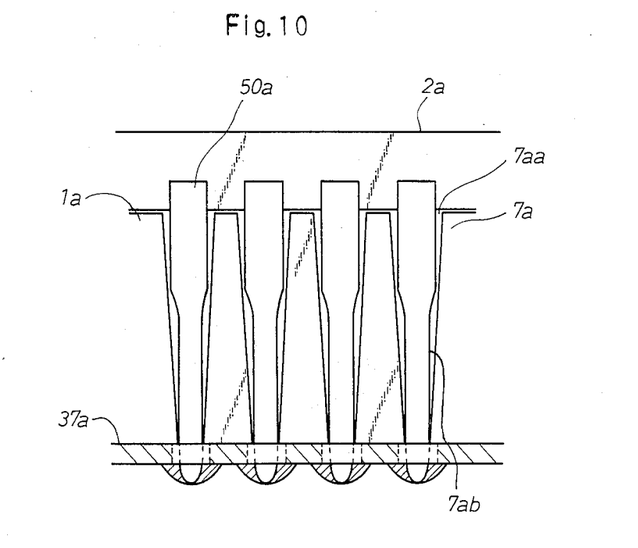
FIG. 10 is a partially enlarged view of the terminal holding member when the electronic display is affixed by utilizing the affixation device.
Figure 11:
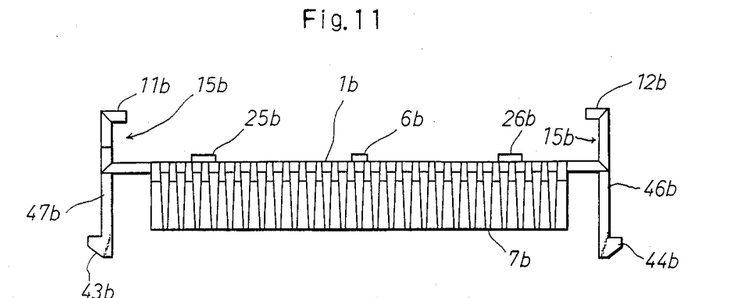
FIG. 11 is a front view of the affixation device of a second embodiment.
Figure 12:
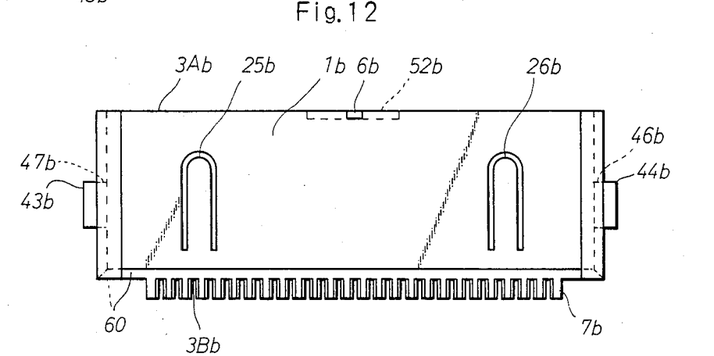
FIG. 12 is a plan view of the affixation device of the second embodiment.
Figure 13:
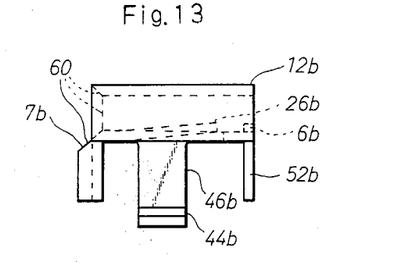
FIG. 13 is a right-hand side view of the affixation device of the second embodiment.
Figure 14:
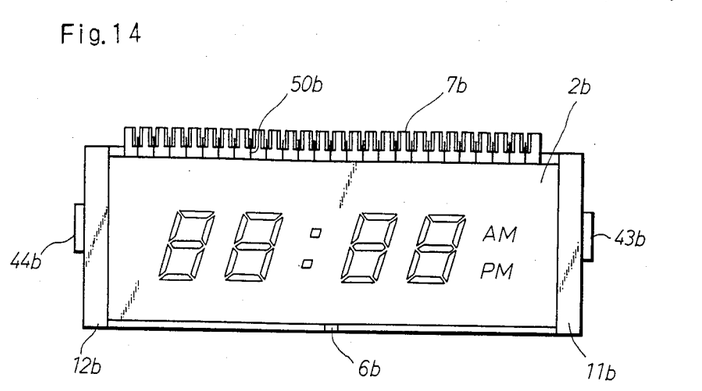
FIG. 14 is a view showing an electronic display affixed by the affixation device of the second embodiment.

FIG. 10 shows an enlarged view indicating that the abovesaid terminal holding member 7a, terminals 50a and the wiring board 37a are set up.

The electronic display 2a put on the platelike rest 1a is affixed in a correct position by the holding members 11a and 12a which are formed at both ends in the longitudinal direction. At the same time, the display is affixed in an exact position with regard to the transverse direction by the two projections 6Aa and 6Ba at the transverse edge 3Aa and the projection 6Ba at the transverse edge 3Ba. The affixation device is attached to the wiring board 37a by the snaps 43a and 44a, and the support legs 46a and 47a. As a result, the electronic display 2a is exactly attached to a predetermined position on a wiring board 37a, and the position of the display 2a is not dislocated either in the longitudinal or transverse directions. For that reason, the display 2a can be exactly positioned to an external casing or the like not shown in the drawings.

Since a relatively large space is left under the affixation device, electronic devices such as an integrated circuit 53a and a resistor 54a can be also mounted as shown in FIG. 9. For that reason, the packaging density of displays on the wiring board can be enhanced.

Furthermore, since the affixation device is integrally formed as a whole, it is easily manufactured, and also the handling is simple. For example, the device can be attached to the wiring board 37a by the one-touch operation of the snaps 43a and 44a.

In this embodiment, the projection 6Aa as a positioning member is of an elastic cantilever construction which prevents imperfect installation of the electronic display 2a.

Although the snaps 43a and 44a furnished with arrowhead-shaped check elements at their tips are used as support members for the affixation device in this embodiment, other snaps of any conventional releasable type may be used instead.

FIGS. 11 thru 15A, B illustrate the second embodiment of this invention.

Although the second embodiment is fundamentally the same as the first embodiment in respect to the construction and the function, there is a little difference in the construction i.e., the way of attaching the electronic display 2b to the affixation device in the second embodiment is different from that of the first embodiment. The following is an explanation of the second embodiment.

Numeral 1b denotes a platelike rest. Numeral 3Ab shows one edge of the platelike rest in its transverse direction, and numeral 3Bb shows another edge. Number 6b illustrates a projection for positioning the display. Numeral 7b shows a terminal holding member. The abovementioned 1b, 3Ab, 3Bb, 6b and 7b have the functions and the constructions fundamentally the same as those of the first embodiment. Numerals 11b and 12b illustrate holding members which are formed at both edges of the platelike rest 1b in its longitudinal direction. The practical difference between the holding members (11a, 12a) of the first embodiment and those (11b, 12b) of the second embodiment is attributable to theis constructional difference. In the second embodiment, the electronic display 2b is set by inserting from the side of the terminal holding member 7b of the rest 1b, while in the first embodiment, the display 2a is set by pushing the upper surface of its body. In such a construction, both edge parts of the display 2b in its longitudinal direction are caught between the U-shaped open space 15b formed by the U-shaped holding members 11b and 12b.

The small pieces 25b and 26b provide the function of leaf springs the same as those (25a, 26a) in the first embodiment. When the display is fixed by the holding members 11b and 12b, they apply a certain stress to the bottom of the display to attach it fast to the rest. Since the electronic display 2b is slidingly inserted from the side of the terminal holding member 7b, the affixation device of the second embodiment is furnished with only leaf springs, and utilizes no projection which may be an obstacle for setting the display.

Moreover, snaps 43b and 44b as support members, and support legs 46b, 47b and 52b are integrally formed at both ends of the back of the platelike rest 1b in its longitudinal direction. The snaps 43b and 44b are furnished with arrowhead-shaped check elements at their tips so as to firmly affix the body of the display as a whole. The abovementioned terminal holding member 7b is integrally formed having a predetermined height for keeping a desired vertical distance between the wiring board and the rest. The second embodiment having the aforementioned construction brings about the following effects due to the fact that the second embodiment has fundamentally the same functions as in the first embodiment but features the holding members 11b and 12b different from those (11a, 12a) of the first embodiment.

When the electronic display is attached to the affixation device, the terminal 50a is firstly inserted into the holding member 7a in the first embodiment, while the electronic display 2b is first held by the holding members 11b and 12b in the second embodiment. For that reason, in the second embodiment, the positioning of the display can be easily made and a failure such as bending the terminal 50b can be prevented. Furthermore, as shown at 60 of FIGS. 12 and 13, by rounding off the corners of the U-shaped portion of the holding members 11b, 12b and the insertion part of the electronic display 2b into the platelike rest 1b and terminal holding members 7b, the insertion part can widen, thereby the insertion becomes much easier.

Figure 15A:
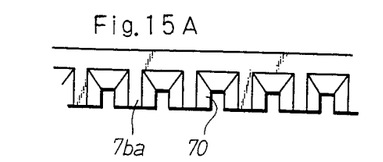
FIGS. 15A and B are partially enlarged views indicating a modified construction of the terminal holding member of the second embodiment.
Figure 15B:
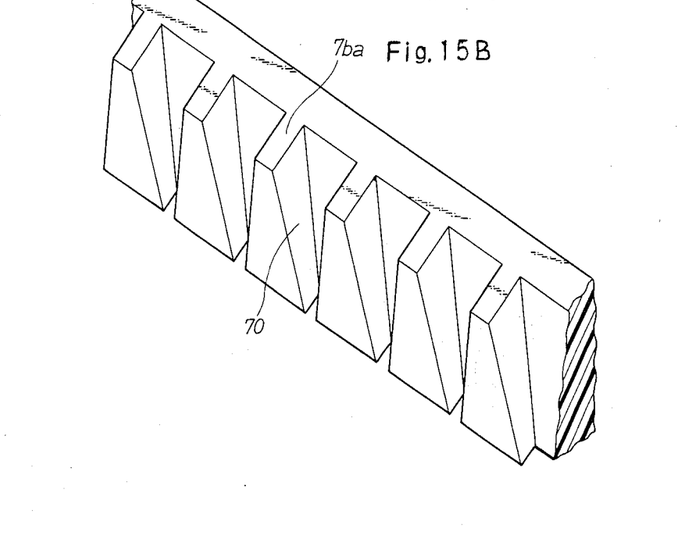
Figure 16:
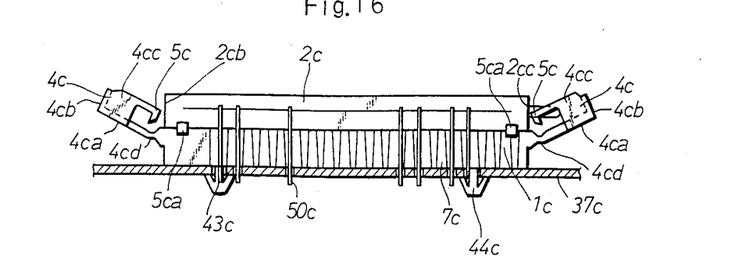
FIG. 16 is a front view of the affixation device of a third embodiment before affixing the electronic display.
Figure 17:
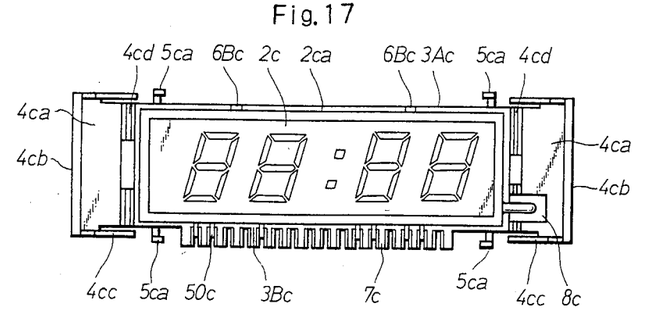
FIG. 17 is a plan view of the affixation device of the third embodiment.
Figure 18:
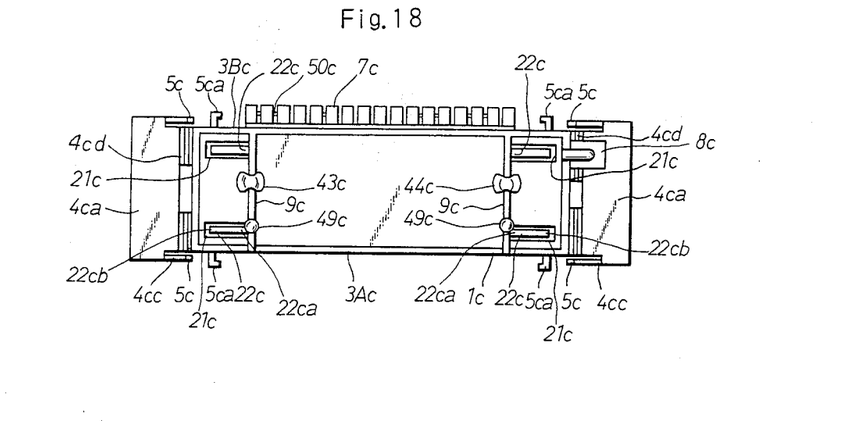
FIG. 18 is a bottom view of the affixation device of the third embodiment.
Figure 19:
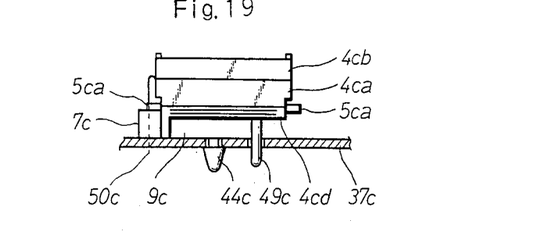
FIG. 19 is a right-hand side view of the affixation device of the third embodiment.
Figure 20:
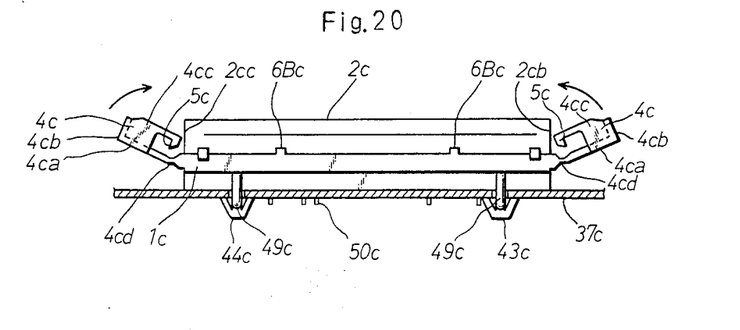
FIG. 20 is a back view of the affixation device of the third embodiment.

By changing the shape of the terminal holding member 7b of the second embodiment to the shape denoted by 7ab shown in FIGS. 15A and B, where the groove 70 is formed to be narrower toward the wiring board and to be wider toward the display, the terminals 50b are aligned so as to be easily inserted into the hole of the wiring board.

FIGS. 16 thru 21 illustrate the third embodiment of this invention.

Although the third embodiment is fundamentally the same as the first embodiment in respect to the construction and the function, there is a little difference in the construction, i.e., the shapes of the holding members 11a and 12a are transformed as shown in the third embodiment. The explanation of the third embodiment is hereinafter given.

Numeral 1c denotes a platelike rest of the electronic display affixation device in the third embodiment. Numeral 2c shows an electronic display. Numerals 2ca, 2cb and 2cc indicate edge parts of the electronic display. Numerals 3Ac and 3Bc denote the edges of the platelike rest 1c. At the edge of the platelike rest 1c in its longitudinal direction, the holding members 4c are formed to hold the edges 2cb and 2cc in the longitudinal direction of the display 2c. The holding members 4c have a construction that a bottom frame 4ca, a longitudinal frame 4cb and the side frame 4cc are incorporated with a platelike rest via a thin portion 4cd. On the side frame 4cc, engaging pawls 5c are formed. Pawl props 5ca project from and are integrally formed with the edges 3Ac and 3Bc of the rest in its longitudinal direction. The pawls 5c are engaged with the pawl props 5ca when the holding member 4c is bent in the direction of the arrowhead shown in FIG. 20, and then the bottom frame 4ca stands almost perpendicularly. Due to this engagement, the display 2c is firmly affixed on the platelike rest 1c. In addition, on the surface of one bottom frame 4ca, a cavity 8c through which the glass-made projection of the display passes is formed.

On the platelike rest 1c, projections 6Bc for preventing disengagement of the display 2c are integrally formed. The terminal holding member 7c has the same function as the terminal holding member 7a in the first embodiment. The grooves of the holding member 7c are formed to be narrower as approaching to the wiring board. In the longitudinal direction of the back surface of the rest 1c, a reinforcing rib 9c, which has a predetermined height for keeping a desired vertical distance between the wiring board 37c and the rest 1c with the terminal holding member 7c, is formed. Furthermore, four rectangular holes 21c are formed on the platelike rest 1c, and the leaf springs 22c are integrally formed with them. The base portions 22ca of the leaf springs 22c are fixed and their tips 22cb are pressed downwardly (to the direction of the wiring board) to generate a repulsive power for separating the platelike rest 1c from the wiring board 37c. Due to the repulsion of the leaf springs 22c and the retaining function of the snaps 43c and 44c, the platelike rest 1c is firmly affixed on the wiring board 37c. In addition, the projections 49c prevent the dislocation of the rest. Numeral 50c denotes the terminals of the display 2c.

According to the third embodiment having the abovementioned constructions, the effect of this embodiment is substantially the same as that of the first embodiment, i.e., when the display 2c is mounted on the affixation device, the terminals 50c can be easily inserted and held by the terminal holding member 7c, thereby the attachment to the wiring board can be done with ease. However, the effect of the holding member 4c of the third embodiment is different from that of the holding members 11a and 12a of the first embodiment as described as follows.

Figure 21:
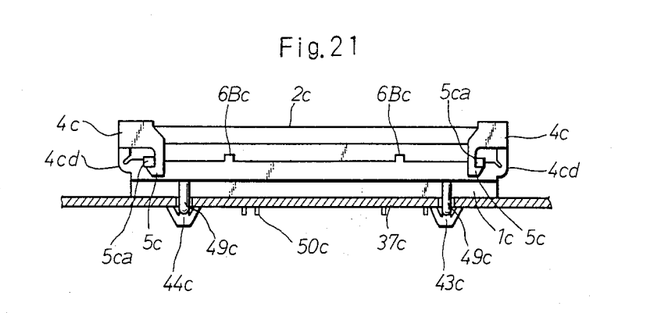
FIG. 21 is the back view of the affixation device of the third embodiment after the electronic display is affixed.

When the electronic display is mounted on the affixation device, firstly the electronic display 2c is set on the affixation device and then affixed by the holding members 4c in the third embodiment. In comparison with the first embodiment, the stress added to the electronic display by the affixation device of the third embodiment enables more stable affixation of the electronic display.

Though all embodiments of this invention are described hereinbefore, this invention is not restricted to the abovementioned embodiments. It is therefore understood that within the scope of the appended claims, the present invention may be practiced otherwise than as specifically described herein.

The affixation device for an electronic display of this invention includes a flat platelike rest on which a platelike electronic display is set, and support members which hold the platelike rest on a wiring board, and a terminal holding member with a plurality of insertion grooves formed at the edge portion of the platelike rest. By forming insertion grooves for the terminal holding members in which the terminals are inserted, at the edge of the platelike rest, the terminals are not only protected but also aligned to be easily inserted into the holes of the wiring board. Since the terminal holding member has such a groovelike construction that one end is opened, the insertion means can be freely chosen and the allowance of the displacement when inserting terminals is increased. By forming the insertion grooves to be narrower as approaching to the wiring board, the groove width of the insertion side becomes wide, thereby the terminals can be easily inserted into the holding members. In addition, the narrowed side in the direction of the wiring board is helpful to align the terminals to be easily inserted into the holes of the wiring board. In case that the insertion process is to be mechanized, a machine with relatively lower accuracy may be permissible and defective attachment will be reduced.

What is claimed as new and desired to be secured by Letters Patent of the United States is:

1. An affixation device for an electronic display which comprises:
    a flat platelike rest on which a platelike electronic display may be set;
    means for securely positioning and holding an electronic display on a first surface of said platelike rest;
    support means for securely positioning and holding said flat platelike rest on a wiring board; and
    terminal holding means having a plurality of insertion grooves and formed at an edge portion of the platelike rest for holding terminals of the electronic display, wherein said terminal holding means comprise a plurality of terminal holding members extending from said edge portion and defining said plurality of insertion grooves therebetween, each of said insertion grooves extending from an open top end thereof adjacent said first surface of said platelike rest to an open bottom end thereof adjacent a bottom surface of said platelike rest, and wherein said grooves being open at a side thereof opposite said edge portion of said platelike rest and tapering to be smaller in width at said bottom end thereof than at said top end thereof.

2. The device as claimed in claim 1, wherein said insertion grooves extend almost perpendicularly to said first surface.

3. The device as claimed in claim 1, wherein said means for positioning and holding an electronic display on said platelike rest comprise projections extending from other edge portions of said platelike rest for contacting edges of an electronic display.

4. The device as claimed in claim 3, wherein said means for positioning and holding an electronic display further comprises holding members extending from said platelike rest having means to grip an electronic display.

5. The device as claimed in claim 4, wherein said means for positioning and holding an electronic display further comprises small pieces extending from said first surface for elastically engaging an electronic display.

6. The device as claimed in claim 1, wherein said support means for positioning and holding said platelike rest include positioning members extending from said platelike rest and fittable into grooves of a wiring board to fix the precise position of said platelike rest.

7. The device as claimed in claim 6, wherein the positioning members comprise support legs.

* * * * *